(12) United States Patent
Jiang et al.

(10) Patent No.: US 10,710,868 B2
(45) Date of Patent: Jul. 14, 2020

(54) MEMS SENSOR

(71) Applicant: Merry Electronics(Shenzhen) Co., Ltd., ShenZhen (CN)

(72) Inventors: Kai-Yu Jiang, Taichung (TW); Jen-Yi Chen, Taichung (TW); Chao-Sen Chang, Taichung (TW)

(73) Assignee: Merry Electronics (Shenzhen) Co., Ltd., ShenZhen (CN)

( * ) Notice: Subject to any disclaimer, the term of this patent is extended or adjusted under 35 U.S.C. 154(b) by 0 days.

(21) Appl. No.: 16/262,927

(22) Filed: Jan. 31, 2019

(65) Prior Publication Data
US 2020/0131024 A1    Apr. 30, 2020

(30) Foreign Application Priority Data

Oct. 30, 2018   (TW) .............................. 107138407 A

(51) Int. Cl.
| | |
|---|---|
| H01L 29/84 | (2006.01) |
| B81B 3/00 | (2006.01) |
| H04R 19/04 | (2006.01) |
| G01N 27/22 | (2006.01) |
| H04R 11/04 | (2006.01) |
| B81B 7/00 | (2006.01) |

(52) U.S. Cl.
CPC ............ *B81B 3/0021* (2013.01); *B81B 7/007* (2013.01); *G01N 27/227* (2013.01); *H04R 11/04* (2013.01); *H04R 19/04* (2013.01); *B81B 2201/0257* (2013.01); *B81B 2201/0264* (2013.01); *B81B 2203/0127* (2013.01); *B81B 2203/04* (2013.01)

(58) Field of Classification Search
CPC .................. B81B 3/0021; B81B 7/007; B81B 2001/0257; B81B 2203/0127; B81B 220/04; B81B 2201/0264; H04R 11/04; H04R 19/04; G01N 27/227
USPC ......................................................... 257/415
See application file for complete search history.

(56) References Cited

U.S. PATENT DOCUMENTS

| | | | |
|---|---|---|---|
| 8,796,790 B2* | 8/2014 | Yang .................... | H04R 19/005 257/416 |
| 9,403,670 B2* | 8/2016 | Schelling .............. | B81B 3/0059 |

* cited by examiner

*Primary Examiner* — Vu A Vu
(74) *Attorney, Agent, or Firm* — JCIPRNET

(57) ABSTRACT

A MEMS sensor including an electrode plate, a diaphragm structure, a support structure, and a pressure relief film. The electrode plate has a conductive portion. The diaphragm structure is disposed at a side of the electrode plate with an interval, and has a sensing film. The support structure is disposed between the diaphragm structure and the electrode plate, and surrounds an electrical coupling zone and a gas flow zone. The support structure includes an inner wall and an outer wall. An outer edge of the gas flow zone is surrounded by the inner wall. An outer edge of the electrical coupling zone is surrounded by the outer wall. The pressure relief film covers the gas flow zone.

15 Claims, 4 Drawing Sheets

MEMS SENSOR

CROSS-REFERENCE TO RELATED APPLICATION

This application claims the priority benefit of Taiwan application serial no. 107138407, filed on Oct. 30, 2018. The entirety of the above-mentioned patent application is hereby incorporated by reference herein and made a part of this specification.

BACKGROUND OF THE DISCLOSURE

Field of the Disclosure

This disclosure relates to an MEMS sensor, and more particularly to an MEMS sensor that automatically adjusts change in air pressure.

Description of Related Art

The diaphragm of MEMS sensor is likely to be damaged by the strong wind in the environment or the instantaneous high pressure generated by the air squeezed by door panel. Nowadays, in order to avoid excessive pressure difference between the inside and outside of the MEMS sensor, a plurality of pressure relief holes are added to the diaphragm of the sensor. When the internal and external parts of the sensor are subjected to a large change of air pressure, the plurality of pressure relief holes may be used to adjust pressure balance inside and outside the sensor.

However, considering that increasing the pressure relief hole is likely to affect the elasticity of the diaphragm and the sensing performance of the sensor, only a small amount of smaller pressure relief holes can be added on the premise that the sensing efficiency is not affected, and the effect of adjusting instantaneous high pressure is relatively poor. Therefore, the existing technical means of using the pressure relief hole still cannot avoid the possibility of damage of the diaphragm caused by pressure difference.

SUMMARY OF THE DISCLOSURE

The disclosure provides an MEMS sensor, capable of significantly remedying the damage of the diaphragm caused by instantaneous pressure difference without performing an additional process to reduce the manufacturing cost.

An MEMS sensor of the disclosure includes an electrode plate, a diaphragm structure, a support structure and a pressure relief film. The electrode plate has a conductive portion. The diaphragm structure is disposed at one side of the electrode plate with an interval and has a sensing film. The support structure is disposed between the diaphragm structure and the electrode plate and surrounds an electrical coupling zone and a gas flow zone. The support structure includes an inner wall and an outer wall. The inner wall surrounds an outer edge of the gas flow zone, and the outer wall surrounds an outer edge of the electrical coupling zone. The pressure relief film covers the gas flow zone.

Based on the above, the MEMS sensor of the present disclosure isolates the gas flow zone from the electrical coupling zone that are independent of each other through the support structure. When the air pressure changes inside or outside the MEMS sensor, the gas acts and passes through the gas flow zone to be discharged into the environment or into the MEMS sensor, thereby adjusting the pressure balance inside and outside the MEMS sensor, thereby significantly remedying the damage caused to the diaphragm structure due to instantaneous pressure changes inside or outside the sensor.

Further, if the gas flow zone and the electrical coupling zone of the MEMS sensor are not isolated from each other, the diaphragm structure corresponding to the electrical coupling zone is likely to cause a low-frequency response to decrease due to a wide range of air leakage, and thus the inner wall of the support structure of the present disclosure ensures that the pressure relief zone is isolated from the electrical coupling zone, avoiding affecting the sensing capability of the electrical coupling zone. In addition, the gas flow zone has a large area of pressure relief path, capable of quickly balancing the internal and external pressure difference of the MEMS sensor to improve the reliability and sensitivity of the MEMS sensor.

In order to make the aforementioned features and advantages of the disclosure more comprehensible, embodiments accompanying figures are described in detail below.

DESCRIPTION OF EMBODIMENTS

Figure 1A:
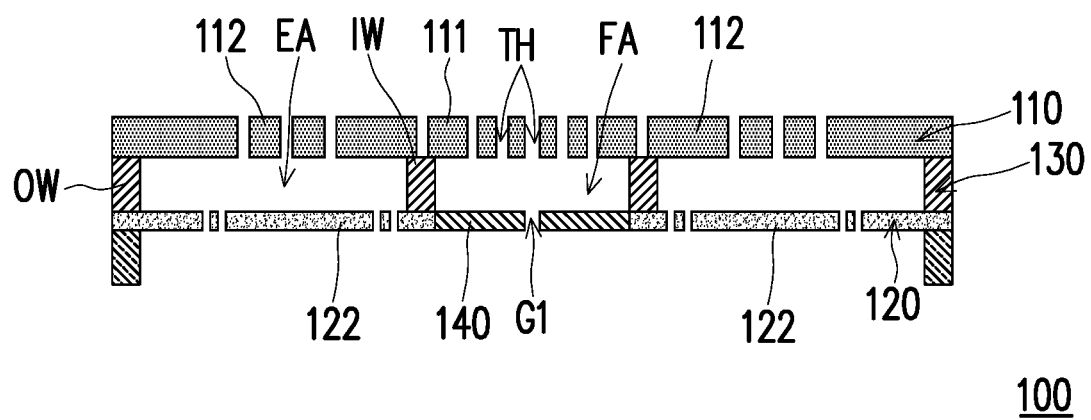
FIG. 1A is a schematic cross-sectional view of an MEMS sensor according to an embodiment of the present disclosure.
Figure 1B:
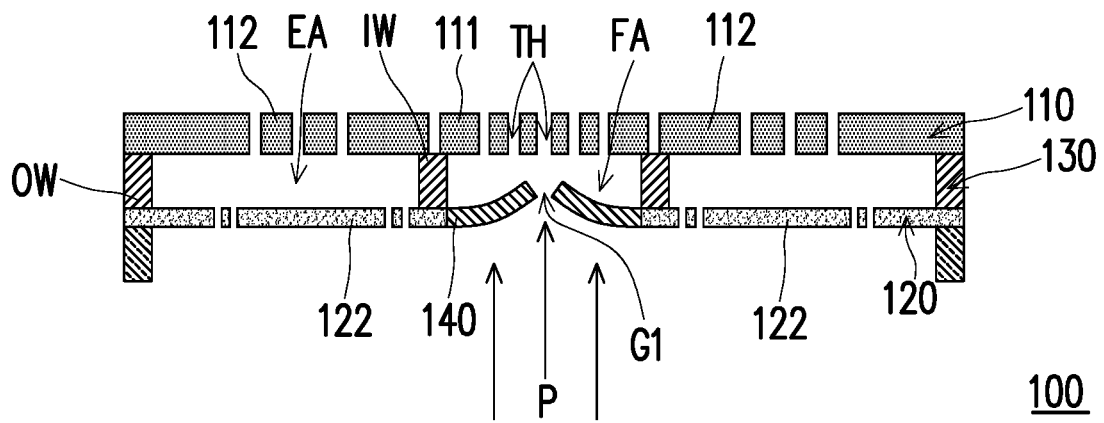
FIG. 1B is a schematic diagram illustrating pressure relief operation of the MEMS sensor in FIG. 1A.
Figure 1C:
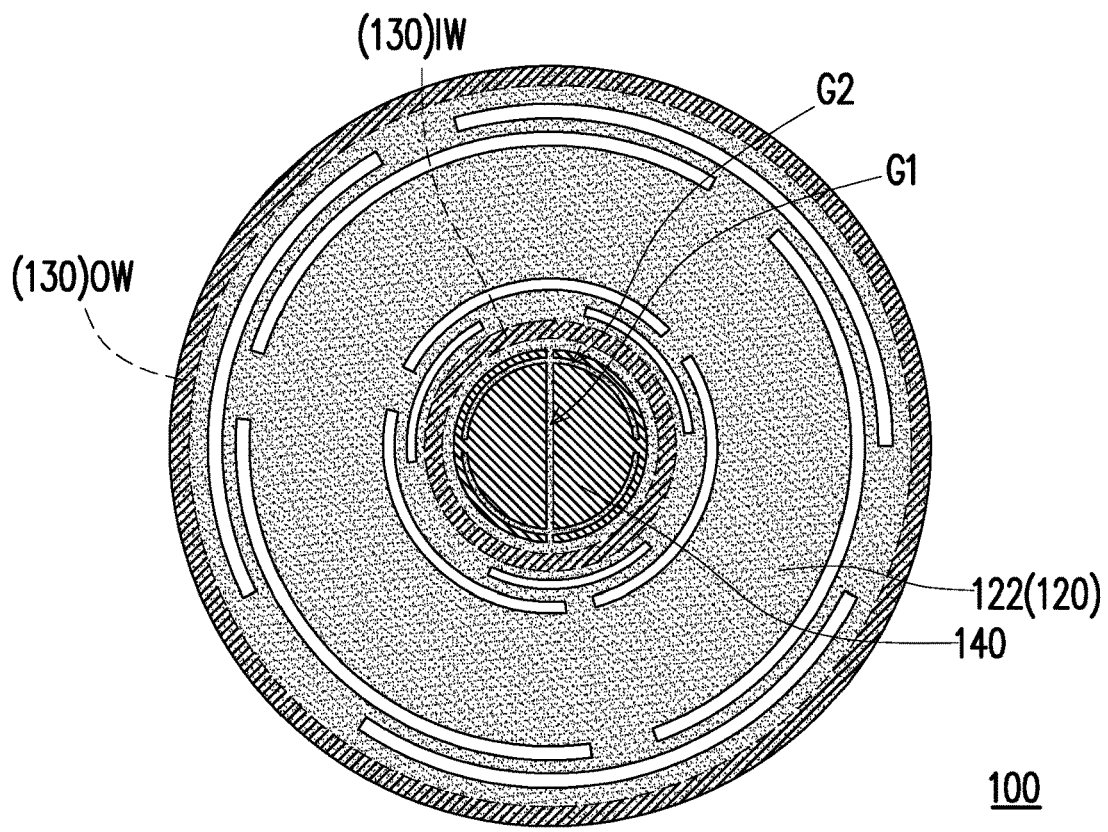
FIG. 1C is a schematic bottom view of the MEMS sensor in FIG. 1A.
Figure 1D:
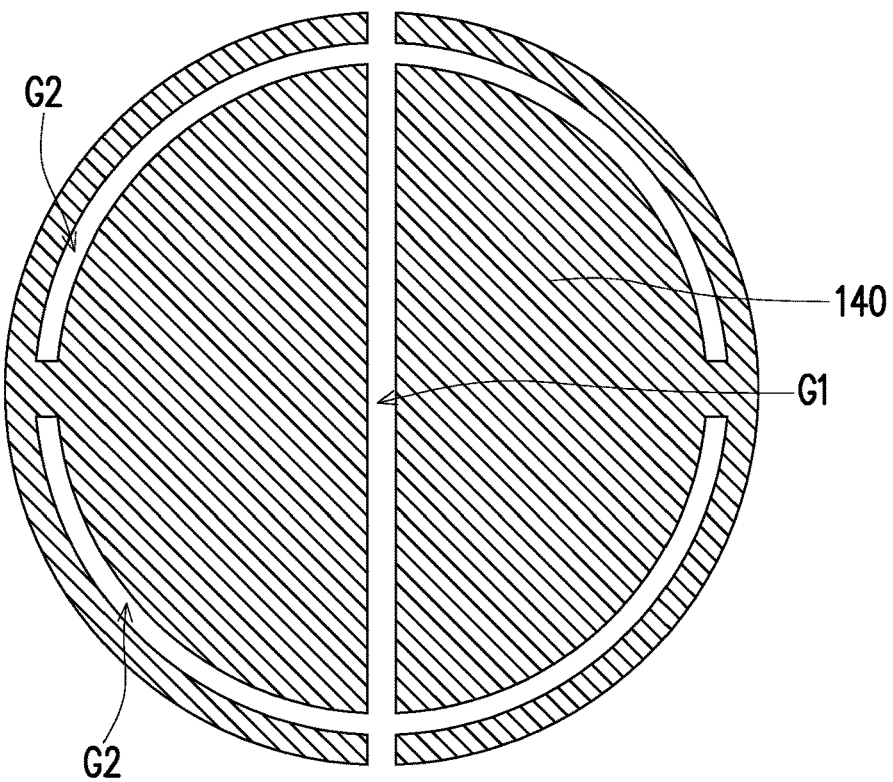
FIG. 1D is a schematic plan view of a pressure relief film of the MEMS sensor in FIG. 1C.

FIG. 1A is a schematic cross-sectional view of an MEMS sensor according to an embodiment of the present disclosure. FIG. 1B is a schematic diagram illustrating pressure relief operation of the MEMS sensor in FIG. 1A. FIG. 1C is a schematic bottom view of the MEMS sensor in FIG. 1A. FIG. 1D is a schematic plan view of a pressure relief film of the MEMS sensor in FIG. 1C.

A microphone (audio receiving device) is a device that converts sound pressure energy into electrical energy, thereby converting sound pressure into electrical signals, thus achieving volume amplification, filtering, changing audio and other related purposes through the back-end signal processing. At present, microphones on the market may be roughly classified into a condenser microphone, a moving-coil microphone, an electret microphone and the like, and the sound pressure energy converting methods of various microphones are different.

An MEMS sensor 100 of the present embodiment is applied, for example, to a condenser microphone. In short, the diaphragm of the condenser microphone is deformed by the effect of sound pressure to cause the capacitance to change. A front-end read circuit converts the capacitance change into a voltage output, and then increases the voltage output signal to the required strength through a back-end circuit amplifier.

Referring to FIG. 1A through FIG. 1D, the MEMS sensor 100 of the present disclosure includes an electrode plate 110, a diaphragm structure 120, a support structure 130, and a pressure relief film 140.

The electrode plate 110 has an exhaust portion 111 and a conductive portion 112. The electrode plate 110 is, for example, a dielectric material including silicon oxide, silicon nitride, silicon oxynitride, a combination of the above materials or the like. The conductive portion 112 further includes an electrode layer, and the electrode layer material is, for example, poly-silicon, doped poly-silicon, metal, metal compounds or other similar conductive materials, and is formed on one side of the conductive portion 112 facing the diaphragm structure 120 through semiconductor processes such as low pressure chemical vapor deposition, plasma enhanced chemical vapor deposition (PECVD), high density plasma chemical vapor, physical vapor deposition or the like.

In the present embodiment, the exhaust portion 111 is disposed at the center of the electrode plate 110 and surrounded by the conductive portion 112. The diaphragm structure 120 is disposed at one side of the electrode plate 110 with an interval and has a sensing film 122. The support structure 130 is disposed between the diaphragm structure 120 and the electrode plate 110, and the MEMS sensor 100 is divided to form an electrical coupling zone EA and a gas flow zone FA. The support structure 130 includes an inner wall IW and an outer wall OW. The inner wall IW surrounds the outer edge of the gas flow zone FA to isolate the gas flow zone FA from the electrical coupling zone EA. The outer wall OW surrounds the outer edge of the electrical coupling zone EA. Further, the exhaust portion 111 is correspondingly disposed on the gas flow zone FA, and the conductive portion 112 is correspondingly disposed on the electrical coupling zone EA.

Referring to FIG. 1A, the pressure relief film 140 of the present embodiment is a portion of the diaphragm structure 120, and the pressure relief film 140 has the same material as the diaphragm structure 120. In detail, the pressure relief film 140 is located within the inner wall IW and suspended in alignment with the exhaust portion 111. The sensing film 122 of the diaphragm structure 120 is disposed between the inner wall IW and the outer wall OW and corresponds to the conductive portion 112. When the sensing film 122 is subjected to sound pressure and deformed toward the conductive portion 112, the capacitance between the sensing film 122 and the conductive portion 112 is varied and thus converted into a corresponding electrical signal.

In addition, since the inner wall IW is disposed between the sensing film 122 and the pressure relief film 140, the two are isolated from each other. When the sensing film 122 corresponding to the electrical coupling zone EA is subjected to sound pressure sensing and vibrated, and the inner wall IW of the support structure 130 may isolate the gas flow zone FA from the electrical coupling zone EA to avoid affecting the sensing ability of the electrical coupling zone EA.

Further, the electrical coupling zone EA is disposed around the outside of the gas flow zone FA, and the gas flow zone FA is an electrically insulating zone. Therefore, the capacitive effect between the pressure relief film 140 and the gas flow zone FA can be avoided, thereby affecting the sensing performance of the MEMS sensor 100. The pressure relief film 140 communicably covers the gas flow zone FA. When the pressure relief film 140 is not deformed by external force, the pressure relief film 140 is in a closed state, otherwise the pressure relief film 140 is switched into an open state to communicate the gas flow zone FA with the external environment.

Referring to FIG. 1A and FIG. 1B, the exhaust portion 111 of the present embodiment includes, for example, a plurality of through holes TH that do not extend beyond the inner wall IW, and the exhaust portion 111, the pressure relief film 140 and the inner wall IW together define the gas flow zone FA.

Further, the pressure relief film 140 further includes a plurality of strip-shaped gaps. The plurality of strip-shaped gaps includes a center gap G1 and a peripheral gap G2 disposed along a circumference of the pressure relief film 140.

In detail, the rigidity of the pressure relief film 140 is smaller than the rigidity of the sensing film 122 through the arrangement of the center gap G1 and the plurality of peripheral gaps G2. When the air pressure P (instantaneous high pressure) in the environment is applied to the diaphragm structure 120, the deformation amount of the pressure relief film 140 is greater than the deformation amount of the sensing film 122 due to the difference in rigidity, so that the pressure relief film 140 is deformed toward the electrode plate 110, thereby communicating the gas flow zone FA with the external environment. Therefore, most of the air pressure P sequentially passes through the pressure relief film 140, the gas flow zone FA, and the exhaust portion 111, and then is discharged out of the MEMS sensor 100, rather than completely acting on the sensing film 122. In this manner, the situation in which the diaphragm structure 120 is damaged by the air pressure P (instantaneous high pressure) is avoided.

Figure 2:
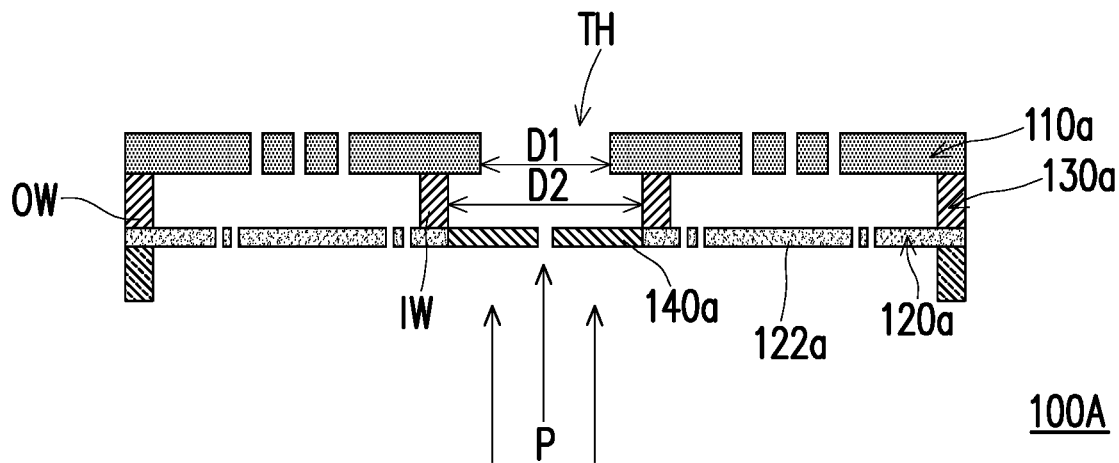
FIG. 2 is a schematic cross-sectional view of an MEMS sensor according to another embodiment of the present disclosure.

FIG. 2 is a schematic cross-sectional view of an MEMS sensor according to another embodiment of the present disclosure.

Please refer to FIG. 1A and FIG. 2. The difference between the MEMS sensor 100A of FIG. 2 and the MEMS sensor 100 of FIG. 1A is that the exhaust portion 111$a$ of the electrode plate 110$a$ is a through hole TH that communicates with the gas flow zone FA such that the inner wall IW of the support structure 130$a$ and the pressure relief film 140$a$ together form a semi-opened space. Specifically, the aperture D1 of the through hole TH is smaller than the inner diameter D2 surrounded by the inner wall IW. In addition, the through hole TH has a larger aperture D1 capable of increasing the pressure relieving speed of the air pressure P.

Figure 3:
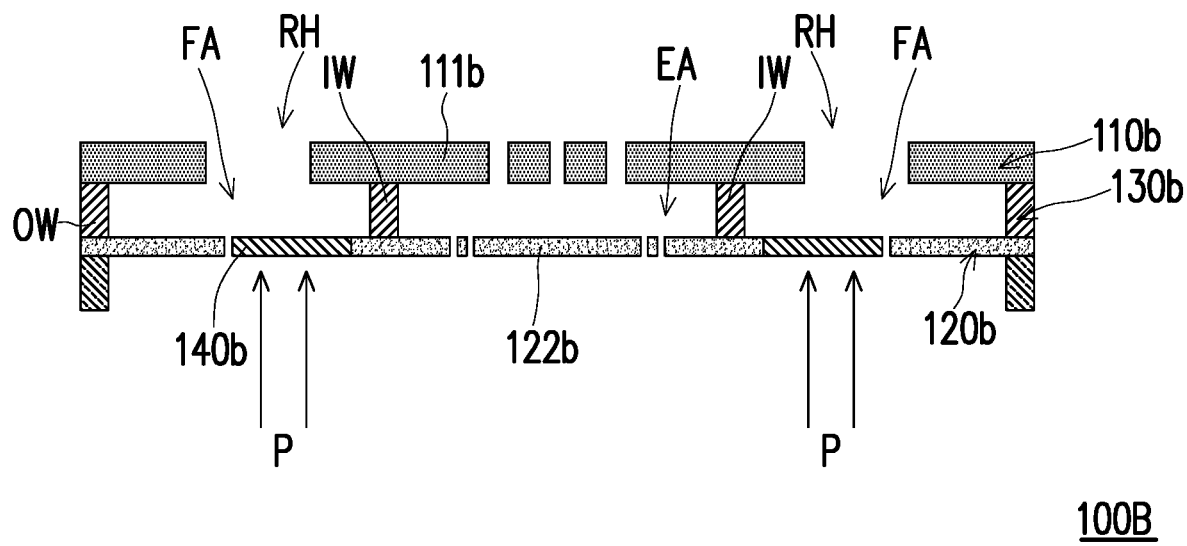
FIG. 3 is a schematic cross-sectional view of an MEMS sensor according to yet another embodiment of the present disclosure.

FIG. 3 is a schematic cross-sectional view of an MEMS sensor according to yet another embodiment of the present disclosure. Please refer to FIG. 1A and FIG. 3. The MEMS sensor 100B of FIG. 3 differs from the MEMS sensor 100 of FIG. 1A in that the gas flow zone FA is an electrically insulating zone and is disposed around the outside of the electrical coupling zone EA. The exhaust portion 111$b$ of the electrode plate 110$b$ is an annular hole RH and correspondingly communicates with the gas flow zone FA. In detail, the diaphragm structure 120$b$ has a pressure relief film 140$b$ and a sensing film 122$b$. The sensing film 122$b$ is disposed in the inner wall IW of the support structure 130$b$, and the pressure relief film 140$b$ is disposed between the inner wall IW and the outer wall OW.

Figure 4A:
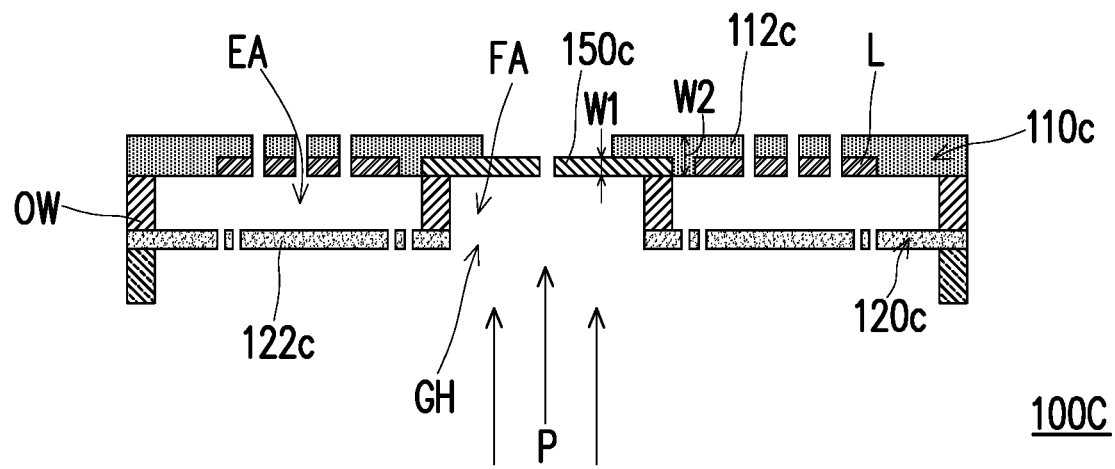
FIG. 4A is a schematic cross-sectional view of an MEMS sensor according to still another embodiment of the present disclosure.
Figure 4B:
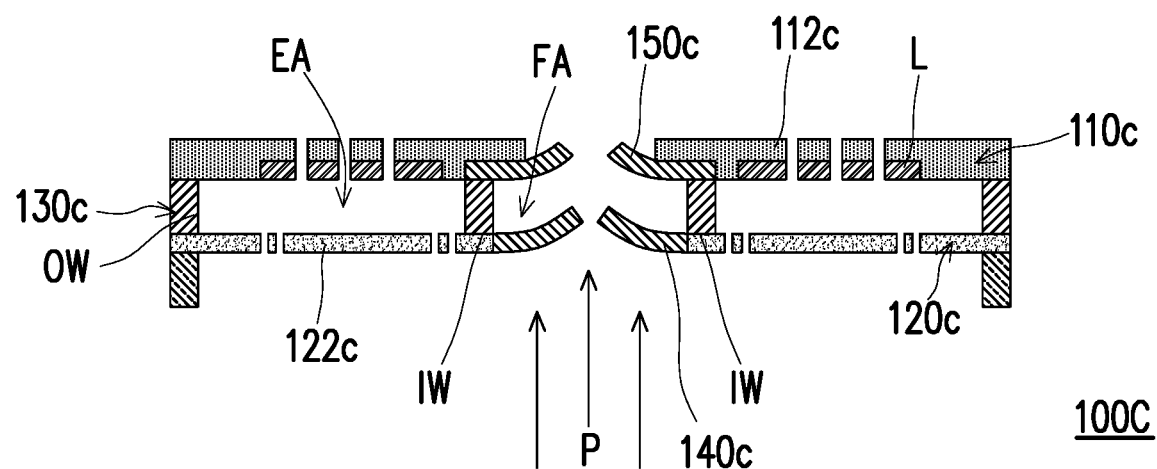
FIG. 4B is a schematic view illustrating the pressure relief operation of the MEMS sensor in FIG. 4A added with another pressure relief film.

FIG. 4A is a schematic cross-sectional view of an MEMS sensor according to still another embodiment of the present disclosure. FIG. 4B is a schematic view illustrating the pressure relief operation of the MEMS sensor in FIG. 4A added with another pressure relief film.

Please refer to FIG. 1A and FIG. 4A. The MEMS sensor 100C of FIG. 4A differs from the MEMS sensor 100 of FIG. 1A in that the MEMS sensor 100C has another pressure relief film 150c, and the pressure relief film 150c of the present embodiment is a part of the electrode plate 110c. The diaphragm structure 120c further includes a guiding hole GH disposed at the center of the diaphragm structure 120c and corresponds to the pressure relief film 150c of the electrode plate 110c. Specifically, the sensing film 122c is disposed between the inner wall IW and the outer wall OW and surrounds the periphery of the guiding hole GH, and the air pressure P directly passes through the guiding hole GH, the gas flow zone FA and acts on the pressure relief film 150c to complete the pressure relieving action.

In addition, the conductive portion 112c of the electrode plate 110c has at least one conductive layer L, and the material of the pressure relief film 150c is the same as the material of the at least one conductive layer L, and the thickness W1 of the pressure relief film 150c is smaller than the thickness W2 of the conductive portion 112c and the gas flow zone FA is an electrically insulating zone, and the pressure relief film 150c covers the gas flow zone FA.

Referring to FIG. 4B, the diaphragm structure 120c of the MEMS sensor 100C has a pressure relief film 140c (similar to the pressure relief film 140 of FIG. 1A) and another pressure relief film 150c (which is the same as the pressure relief film 150c of FIG. 4A). The pressure relief film 140c is disposed within the inner wall IW of the support structure 130c and is aligned with the other pressure relief film 150c with interval. The pressure relief film 150c is disposed on the other side of the gas flow zone FA with respect to the pressure relief film 140c. Therefore, the other pressure relief film 150c and the pressure relief film 140c together with the gas flow zone FA form a closed space. In addition, the MEMS sensor 100C is provided with two pressure relief films 150c, 140c. When the MEMS sensor 100C is not subjected to the ambient air pressure P, the gas flow zone FA has better sealing characteristics.

In summary, the MEMS sensor of the present disclosure divides the diaphragm structure into the gas flow zone and the electrical coupling zone that are independent of each other through the support structure. When the air pressure changes inside or outside the MEMS sensor, the gas acts and passes through the gas flow zone to be discharged into the environment or into the MEMS sensor, thereby adjusting the pressure balance inside and outside the MEMS sensor, thereby significantly remedying the damage caused to the diaphragm structure due to instantaneous pressure changes inside or outside the sensor.

Further, if the gas flow zone and the electrical coupling zone of the MEMS sensor are not isolated from each other, the diaphragm structure corresponding to the electrical coupling zone is likely to cause a low-frequency response to decrease due to a wide range of air leakage, and thus the inner wall of the support structure of the present disclosure ensures that the pressure relief zone is isolated from the electrical coupling zone, avoiding affecting the sensing capability of the electrical coupling zone. In addition, the gas flow zone has a large area of pressure relief path, capable of quickly balancing the internal and external pressure difference of the MEMS sensor to improve the reliability and sensitivity of the MEMS sensor.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. An MEMS sensor, comprising:
   an electrode plate having a conductive portion;
   a diaphragm structure disposed at one side of the electrode plate with an interval and having a sensing film;
   a support structure disposed between the diaphragm structure and the electrode plate and surrounding an electrical coupling zone and a gas flow zone, the support structure comprising an inner wall and an outer wall, the inner wall surrounding an outer edge of the gas flow zone, the outer wall surrounding an outer edge of the electrical coupling zone; and
   a pressure relief film covering the gas flow zone, wherein when the pressure relief film is deformed by an external force, the pressure relief film is switched into an open state to communicate the gas flow zone with an external environment.

2. The MEMS sensor according to claim 1, wherein when air pressure is applied to the diaphragm structure, a deformation amount of the pressure relief film is greater than a deformation amount of the sensing film.

3. The MEMS sensor according to claim 1, wherein the gas flow zone is an electrically insulating zone, the electrical coupling zone is disposed around the outside of the gas flow zone.

4. The MEMS sensor according to claim 1, wherein the gas flow zone is an electrically insulating zone, the gas flow zone is disposed around the outside of the electrical coupling zone.

5. The MEMS sensor according to claim 1, wherein the electrode plate further has an exhaust portion, wherein the exhaust portion is correspondingly disposed on the gas flow zone, and the conductive portion is correspondingly disposed on the electrical coupling zone.

6. The MEMS sensor according to claim 5, wherein the exhaust portion is a through hole communicating with the gas flow zone such that the inner wall and the pressure relief film together form a semi-opened space.

7. The MEMS sensor according to claim 6, wherein an aperture of the through hole is smaller than an inner diameter surrounded by the inner wall.

8. The MEMS sensor according to claim 5, wherein the exhaust portion comprises a plurality of through holes, the exhaust portion, the pressure relief film and the inner wall together define the gas flow zone.

9. The MEMS sensor according to claim 1, wherein the pressure relief film further comprises a plurality of strip-shaped gaps.

10. The MEMS sensor according to claim 9, wherein the strip-shaped gaps comprise a center gap and a peripheral gap disposed along a circumference of the pressure relief film.

11. The MEMS sensor according to claim 1, wherein the pressure relief film is a portion of the diaphragm structure, and the pressure relief film is the same material as the diaphragm structure.

12. The MEMS sensor according to claim 1, wherein the pressure relief film is a portion of the electrode plate, and the pressure relief film is the same material as the conductive portion.

13. The MEMS sensor according to claim 12, wherein the thickness of the pressure relief film is smaller than the thickness of the conductive portion.

14. The MEMS sensor according to claim 12, wherein the diaphragm structure further comprises a guiding hole disposed at a center of the diaphragm structure.

15. The MEMS sensor according to claim 12, wherein the MEMS sensor further has another pressure relief film disposed on the other side of the gas flow zone with respect to the pressure relief film.

* * * * *